United States Patent
Park et al.

(10) Patent No.: US 8,495,283 B2
(45) Date of Patent: Jul. 23, 2013

(54) NONVOLATILE MEMORY DEVICE, MEMORY SYSTEM COMPRISING NONVOLATILE MEMORY DEVICE, AND WEAR LEVELING METHOD FOR NONVOLATILE MEMORY DEVICE

(75) Inventors: Min Gun Park, Yongin-si (KR); Ki Tae Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 312 days.

(21) Appl. No.: 12/947,003

(22) Filed: Nov. 16, 2010

(65) Prior Publication Data
US 2011/0131367 A1    Jun. 2, 2011

(30) Foreign Application Priority Data
Nov. 27, 2009    (KR) .................. 10-2009-0116010

(51) Int. Cl.
*G06F 12/00* (2006.01)
(52) U.S. Cl.
USPC ........................................................ 711/103
(58) Field of Classification Search
None
See application file for complete search history.

(56) References Cited

U.S. PATENT DOCUMENTS

| 6,016,275 | A | 1/2000 | Han |
| 7,441,067 | B2 * | 10/2008 | Gorobets et al. ............... 711/103 |
| 7,924,622 | B2 * | 4/2011 | Lee et al. .................... 365/185.2 |
| 8,103,821 | B2 * | 1/2012 | Chang et al. ................... 711/103 |
| 8,305,812 | B2 * | 11/2012 | Levy et al. ............... 365/185.19 |
| 2006/0022259 | A1 * | 2/2006 | Kobayashi et al. ........... 257/321 |
| 2008/0106936 | A1 | 5/2008 | Yang et al. |
| 2008/0147998 | A1 | 6/2008 | Jeong |
| 2008/0288814 | A1 * | 11/2008 | Kitahara ........................... 714/5 |

FOREIGN PATENT DOCUMENTS

| JP | 11297079 A | 10/1999 |
| JP | 2008152909 A | 7/2008 |
| KR | 100297986 B1 | 5/2001 |
| KR | 1020080056580 A | 6/2008 |
| KR | 1020090077856 A | 7/2009 |

* cited by examiner

*Primary Examiner* — Hiep Nguyen
(74) *Attorney, Agent, or Firm* — Volentine & Whitt, PLLC

(57) ABSTRACT

A nonvolatile memory device comprises a memory core and a controller for controlling the wear level of a memory block in the nonvolatile memory device. The controller determines the wear level of a memory block by obtaining data of an actual wear level from a charge measurement cell of a selected region of the memory cell, and stores the wear level of the selected region in an erase count table.

18 Claims, 14 Drawing Sheets

NONVOLATILE MEMORY DEVICE, MEMORY SYSTEM COMPRISING NONVOLATILE MEMORY DEVICE, AND WEAR LEVELING METHOD FOR NONVOLATILE MEMORY DEVICE

CROSS-REFERENCE TO RELATED APPLICATIONS

This application claims priority under 35 U.S.C. §119 to Korean Patent Application No. 10-2009-0116010 filed on Nov. 27, 2009, the disclosure of which is hereby incorporated by reference in its entirety.

BACKGROUND

Embodiments of the inventive concept relate generally to electronic memory technologies. More particularly, embodiments of the inventive concept relate to nonvolatile memory devices, memory systems comprising nonvolatile memory devices, and wear leveling methods for nonvolatile memory devices.

Nonvolatile memory is a type of memory that retains stored data when disconnected from power. One popular form of nonvolatile memory is flash memory, which can be found in a wide range of modern electronic devices, such as computers, portable memory drives, home electronics, cellular phones, and digital cameras, to name but a few.

Unlike some other forms of memory, flash memory cannot be rewritten without first performing an erase operation. In other words, before new data can be written to a memory cell of a flash memory device, any old data must be erased from the memory cell. Each block of a flash memory is limited in the number of erase operations that it can undergo before it wears out. This limitation is referred to as erase endurance, and it tends to vary between different flash memories. As an example, many flash memories have an erase endurance of ten thousand to one million erase cycles.

Once a memory block wears out, its memory cells can no longer reliably store data. Accordingly, to avoid errors that can arise from unreliable memory blocks, flash memories often maintain an erase count for each memory block to ensure that the memory blocks are not erased beyond their erase endurance. The erase count can also be used, for instance, to perform wear leveling, which aims to control the distribution of erase operations among different memory blocks. Typically, wear leveling is used to prevent different memory blocks from wearing out at significantly different rates.

SUMMARY

Embodiments of the inventive concept provide nonvolatile memory devices, memory systems comprising the nonvolatile memory devices, and wear leveling methods for the nonvolatile memory devices. In some embodiments, the nonvolatile memory devices have improved performance and lifetime compared with conventional nonvolatile memory devices.

According to one embodiment of the inventive concept, a method is provided for operating a nonvolatile memory device comprising a plurality of memory blocks each comprising at least one charge loss measurement cell. The method comprises measuring a threshold voltage change of the at least one charge loss measurement cell in a selected memory block among the plurality of memory blocks, detecting an erase count of the selected memory block, calculating an effective erase count of the selected memory block based on the measured threshold voltage change and the erase count.

In certain embodiments, the method further comprises controlling the wear levels of memory blocks according to the calculated effective erase count.

In certain embodiments, the method further comprises storing the effective erase count of the selected memory block in an effective erase count table within the nonvolatile memory device, the effective erase count table comprising effective erase count values for each of the plurality of memory blocks.

In certain embodiments, the method further comprises erasing the selected memory block.

In certain embodiments, the method further comprises performing wear leveling by accessing the effective erase count table to determine a next memory block to erase. In certain embodiments, the next memory block to erase is a memory block having a lowest effective erase count in the effective erase count table.

In certain embodiments, measuring the threshold voltage change comprises reading the at least one charge loss measurement cell using a read voltage, and iteratively decreasing the read voltage by a predetermined amount until a value read from the at least one charge loss measurement cell changes logic state.

In certain embodiments, the nonvolatile memory device is a NAND flash memory device. In certain embodiments, the nonvolatile memory device is a multi-level cell flash memory device.

According to another embodiment of the inventive concept, a nonvolatile memory device comprises a plurality of memory blocks each comprising at least one charge loss measurement cell, an erase count table storing an erase count of each of the memory blocks, and an effective erase count table storing effective erase count values for each of the memory blocks, wherein each of the effective erase count values is calculated according the erase count of a corresponding memory block and a threshold voltage change level measured from the at least one charge loss measurement cell of the corresponding memory block.

In certain embodiments, wear levels of the memory blocks are maintained substantially uniform according to the effective erase count table.

According to another embodiment of the inventive concept, a memory system comprises a nonvolatile memory device comprising a plurality of memory blocks, and a memory controller configured to control the nonvolatile memory device, to measure a wear level of each of the memory blocks, and to control wear levels of the memory blocks according to the measured wear level and an erase count.

In certain embodiments, the memory controller measures a wear level of each of the memory blocks by determining a threshold voltage shift of at least one threshold voltage change measurement cell within each of the memory blocks.

In certain embodiments, the nonvolatile memory device is a NAND flash memory device.

In certain embodiments, the memory controller determines a wear level of a memory block based on a time interval that has elapsed since a last read or write operation performed on the memory block.

In certain embodiments, the memory controller determines a wear level of a memory block based on an operating temperature of the memory block.

In certain embodiments, the at least one charge loss measurement cell is in a programmed state when the threshold voltage shift is determined.

In certain embodiments, the memory controller comprises a threshold voltage shift measure controller configured to measure a threshold voltage of the at least one charge loss measurement cell, to calculate the threshold voltage shift according to the measured threshold voltage, and to calculate an effective erase count of each of the memory blocks according to the erase count and the calculated threshold voltage change.

In certain embodiments, the memory controller comprises an effective erase count table for storing the effective erase count.

In certain embodiments, the memory controller controls the wear levels by accessing the effective erase count table and identifying a memory block having a lowest effective erase count as a next memory block to erase.

BRIEF DESCRIPTION OF THE DRAWINGS

The drawings illustrate selected embodiments of the inventive concept. In the drawings, like reference numbers indicate like features.

DETAILED DESCRIPTION OF THE EMBODIMENTS

Selected embodiments of the inventive concept are described below with reference to the accompanying drawings. These embodiments are presented as teaching examples and should not be construed to limit the scope of the inventive concept.

In certain embodiments, wear leveling is performed on a nonvolatile memory device based on measurements related to the actual wear level of memory blocks rather than merely a number of erase cycles on each memory block. In some embodiments, a write operation is controlled based on an effective cycle table indicating an effective number of erase cycles of each memory block. The effective number of erase cycles can be determined from certain measurements performed on memory cells within each memory block. These measurements can include, for instance, temperature, passage of time since programming, and erase count. As will be described below, these different measurements tend to affect charge trapping of the memory cells, which relates to their effective cycle count.

In the description that follows, NAND flash memory is used as an example of a nonvolatile memory device to explain various embodiments. However, the inventive concept is not limited to NAND flash memory devices, and can be embodied in other types of nonvolatile memory devices, such as NOR flash memory devices, resistive random access memory (RRAM) devices, phase-change random access memory (PRAM) devices, magnetoresistive random access memory (MRAM) devices, ferroelectric random access memory (FRAM) devices, spin transfer torque random access memory (STT-RAM) devices, and various nonvolatile memory devices having a three-dimensional array structure.

Figure 1:
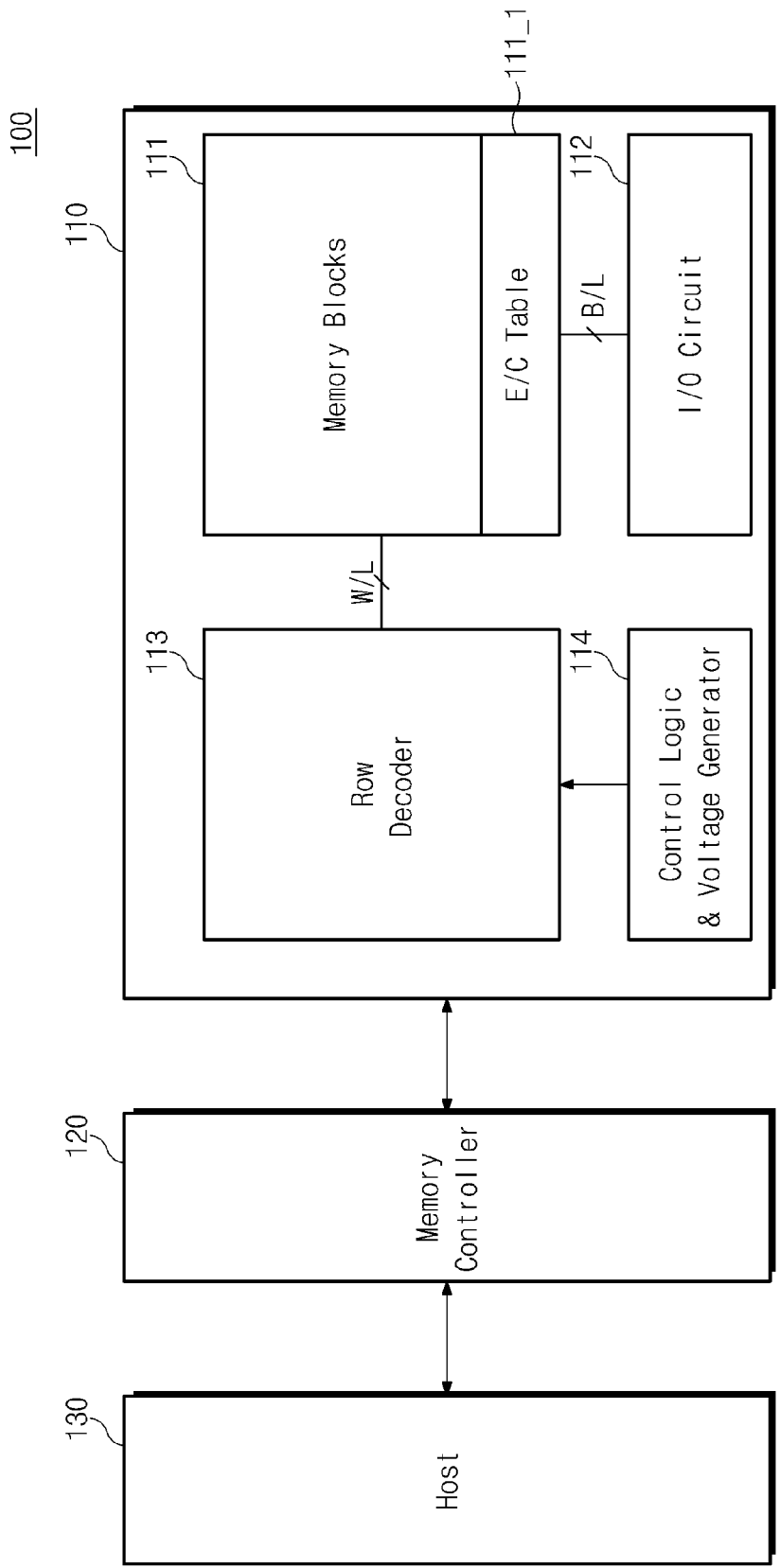
FIG. 1 is a block diagram illustrating a memory system according to an embodiment of the inventive concept.

FIG. 1 is a block diagram illustrating a memory system 100 according to an embodiment of the inventive concept.

Referring to FIG. 1, memory system 100 comprises a flash memory device 110, a memory controller 120, and a host 130. Flash memory device 110 comprises a memory cell array 111, an input/output (I/O) circuit 112, a row decoder 113, and a control logic and voltage generator 114.

Memory cell array 111 comprises a plurality of memory blocks, and each of the memory blocks comprises a plurality of pages. Moreover, each of the pages comprises a plurality of memory cells each storing single-bit data or multi-bit data. Flash memory device 110 performs erase operations on a block basis and performs read/write operations on a page basis. Memory cell array 111 is divided into a memory block region and an erase count (E/C) table region comprising an E/C table 111_1.

Flash memory device 110 does not support an overwrite function, and therefore memory cells must be erased before they can be rewritten. Accordingly, to update a page of data, a new version of the page is typically written into a new memory block, and the original version of the page is marked as invalid. As the number of invalid pages increases, the available capacity of the semiconductor memory device decreases, and therefore a merge operation may be performed on a memory block having invalid pages in order to free up memory space. In the merge operation, valid data is moved from a first memory block to a second memory block, and the first memory block is erased.

E/C table 111_1 stores an erase count of each memory block in memory cell array 111. The erase count is also referred to as a program/erase (P/E) cycle number. The erase count of a memory block increases each time the memory block is erased. Because some memory blocks may be erased more frequently than others, flash memory device 110 uses the erase count information in combination with other information to prevent some memory blocks from becoming worn out much more quickly than others.

I/O circuit 112 is connected to memory cell array 111 via bit lines B/L. I/O circuit 112 receives data through a data I/O line (not illustrated). The received data is stored in memory cell array 111. I/O circuit 112 reads data from memory cell array 111 through bit lines B/L and outputs the read data to an external device via the data I/O line.

Row decoder 113 is connected to memory cell array 111 via word lines W/L. Row decoder 113 receives an address and selects a memory block or a page based on the address. An address for selecting a memory block is referred to as a block address, and an address for selecting a page is referred to as a page address.

Control logic and voltage generator 114 controls I/O circuit 112 and row decoder 113 in response to a control signal or command received from memory controller 120. Control logic and voltage generator 114 generates a bias voltage to be provided to a word line in a write/read operation. In a read operation, control logic and voltage generator 114 generates a select read voltage to be provided to a selected word line and an unselect read voltage to be provided to an unselected word line. The unselect read voltage is generally higher than the select read voltage.

Memory controller 120 controls flash memory device 110 in response to a request from host 130. Memory controller 120 measures an actual wear level of flash memory device 110 and controls the wear level according to the measurement. Memory controller 120 obtains data regarding the actual wear level from a charge measure cell in a selected region of a memory cell. Memory controller 120 stores the wear level data in the erase count (E/C) table, and performs write operations on memory blocks having relatively low amounts of wear according to the wear level data. This prevents some memory blocks from wearing out much more quickly than others.

An example of a wear leveling method performed by memory controller 120 is described below with reference to FIGS. 2 to 9.

FIGS. 2 through 5 are graphs illustrating changes in charge trap amount as a function of erase count and other factors. The charge trap amount refers to an amount of charges trapped in an oxide layer of a memory cell. Charge trap amount tends to increase as memory cells wear out. In FIGS. 2 through 5, the x-axis represents erase count, or number of erase cycles, and the y-axis represents charge trap amount.

Figure 2:
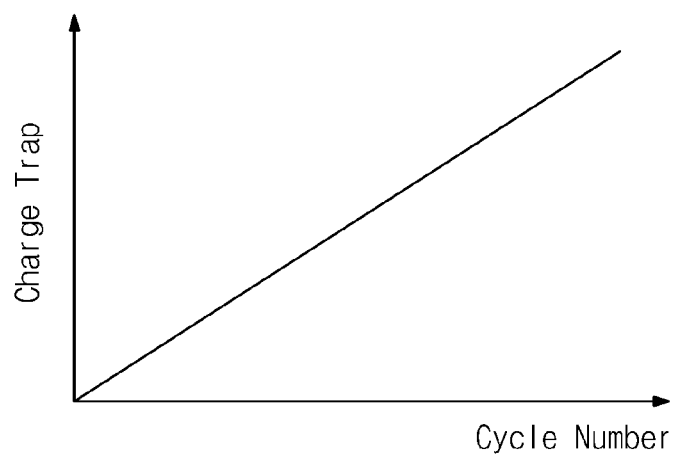
FIG. 2 is a graph illustrating a change in a charge trap amount of a memory cell according to an erase count.
Figure 3:
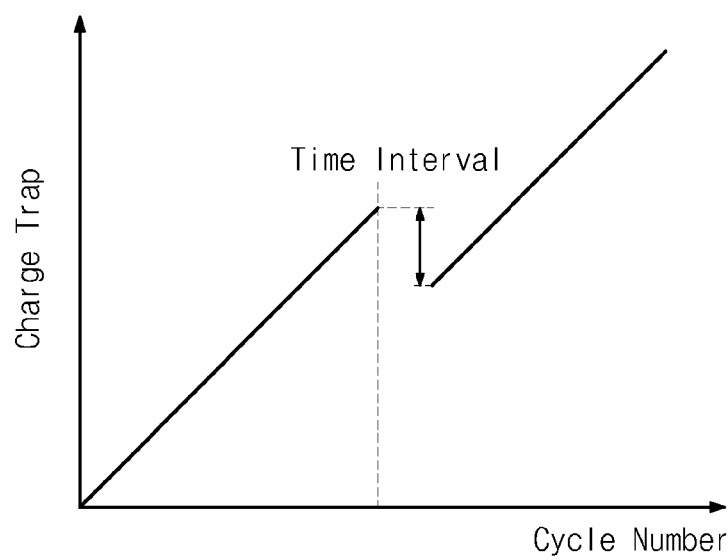
FIG. 3 is a graph illustrating a change in a charge trap amount of a memory cell according to an erase count and the passage of time.
Figure 4:
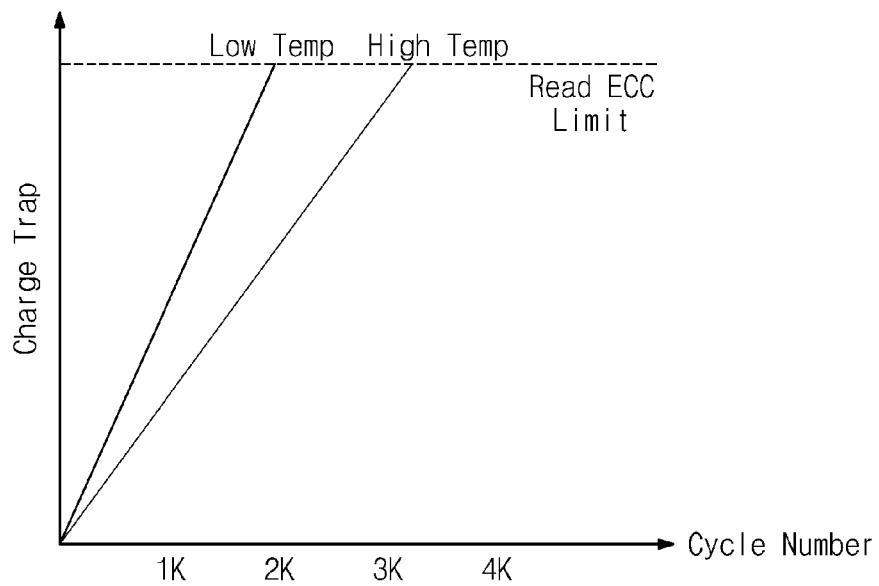
FIG. 4 is a graph illustrating a change in a charge trap amount of a memory cell according to an erase count and a temperature change.
Figure 5:
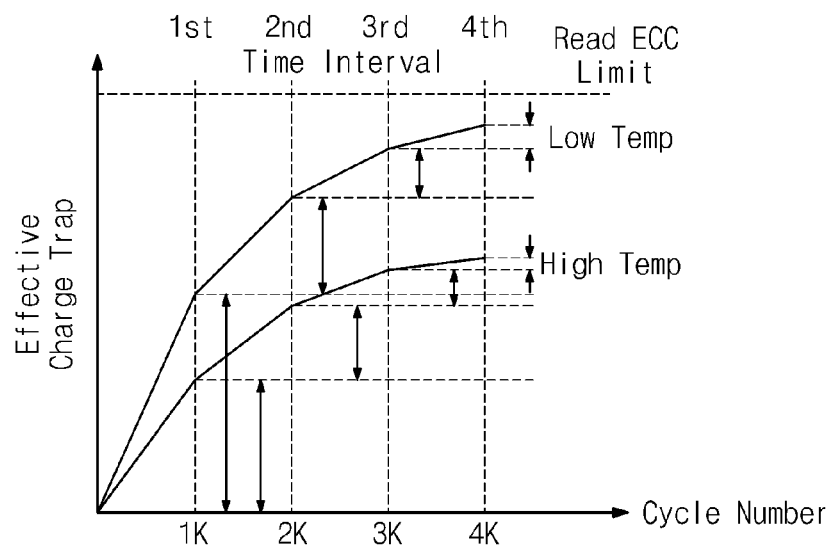
FIG. 5 is a graph illustrating a change in a charge trap amount of a memory cell according to an erase count, a temperature change, and the passage of time.

FIG. 2 is a graph illustrating a change in charge trap amount according to erase count alone. FIG. 3 is a graph illustrating a change in charge trap amount according to erase count and the passage of time. FIG. 4 is a graph illustrating a change in charge trap amount according to erase count and changes in temperature. FIG. 5 is a graph illustrating a change in charge trap amount according to erase count, the passage of time, and changes in temperature.

Referring to FIG. 2, charge trapping increases in proportion to erase count. This increase in charge trapping causes memory cells to shift threshold voltage, which can result in data errors. However, if wear leveling is performed according to erase count alone, it may be inaccurate because other factors can influence charge trapping as well.

Referring to FIG. 3, charge trapping can decrease with the passage of time. This decrease can cause the threshold voltages of memory cells to shift undesirably, which can lead to data errors.

Referring to FIG. 4, temperature differences can affect charge trapping. In particular, low-temperature charge trapping tends to be lower than high-temperature charge trapping. Accordingly, memory controller 120 of FIG. 1 can determine that memory cells of flash memory device 110 wear out more quickly at lower temperatures.

Referring to FIG. 5, charge trapping changes according to erase count in combination with temperature and the passage of time. In FIG. 5, the x-axis represents erase count, and the y-axis represents an effective charge trap amount. As indicated in relation to FIGS. 3 and 4, the charge trap amount tends to decrease due to the passage of time and lower temperatures.

Figure 6:
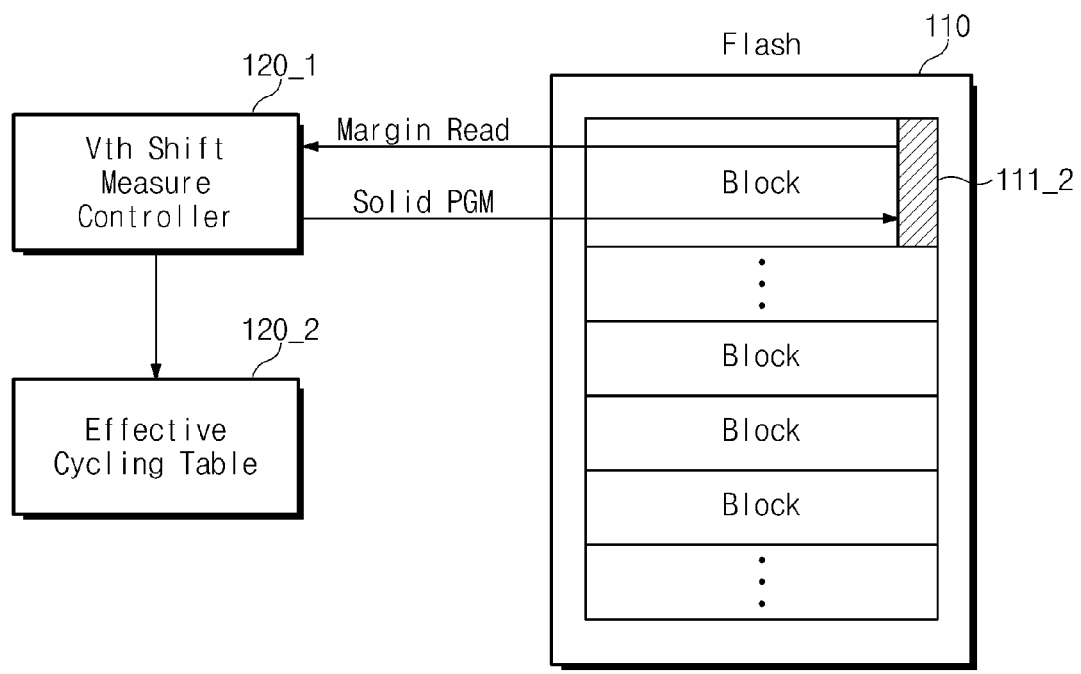
FIG. 6 is a block diagram illustrating a wear leveling method according to an embodiment of the inventive concept.

FIG. 6 is a block diagram illustrating a configuration of memory controller 120 and flash memory device 110 according to an embodiment of the inventive concept. This block diagram will be used to describe a wear leveling method according to an embodiment of the inventive concept.

In the embodiment of FIG. 6, memory controller 120 comprises a threshold voltage (Vth) shift measurement controller 120_1 and an effective erase count table 120_2, also referred to as effective cycling table 120_2.

Threshold voltage shift measurement controller 120_1 measures a threshold voltage of a charge loss measurement cell 111_2 in each memory block of flash memory device 110, calculates a wear level of the memory block according to the measured threshold voltage, calculates an effective erase count according to the calculated wear level, and stores the calculated effective erase count in effective erase count table 120_2. At the time of measurement, charge loss measurement cell 111_2 can be in a programmed state.

In some embodiments, each memory block comprises one charge loss measurement cell. In other embodiments, a memory block can comprise two or more charge loss measurement cells.

Figure 7:
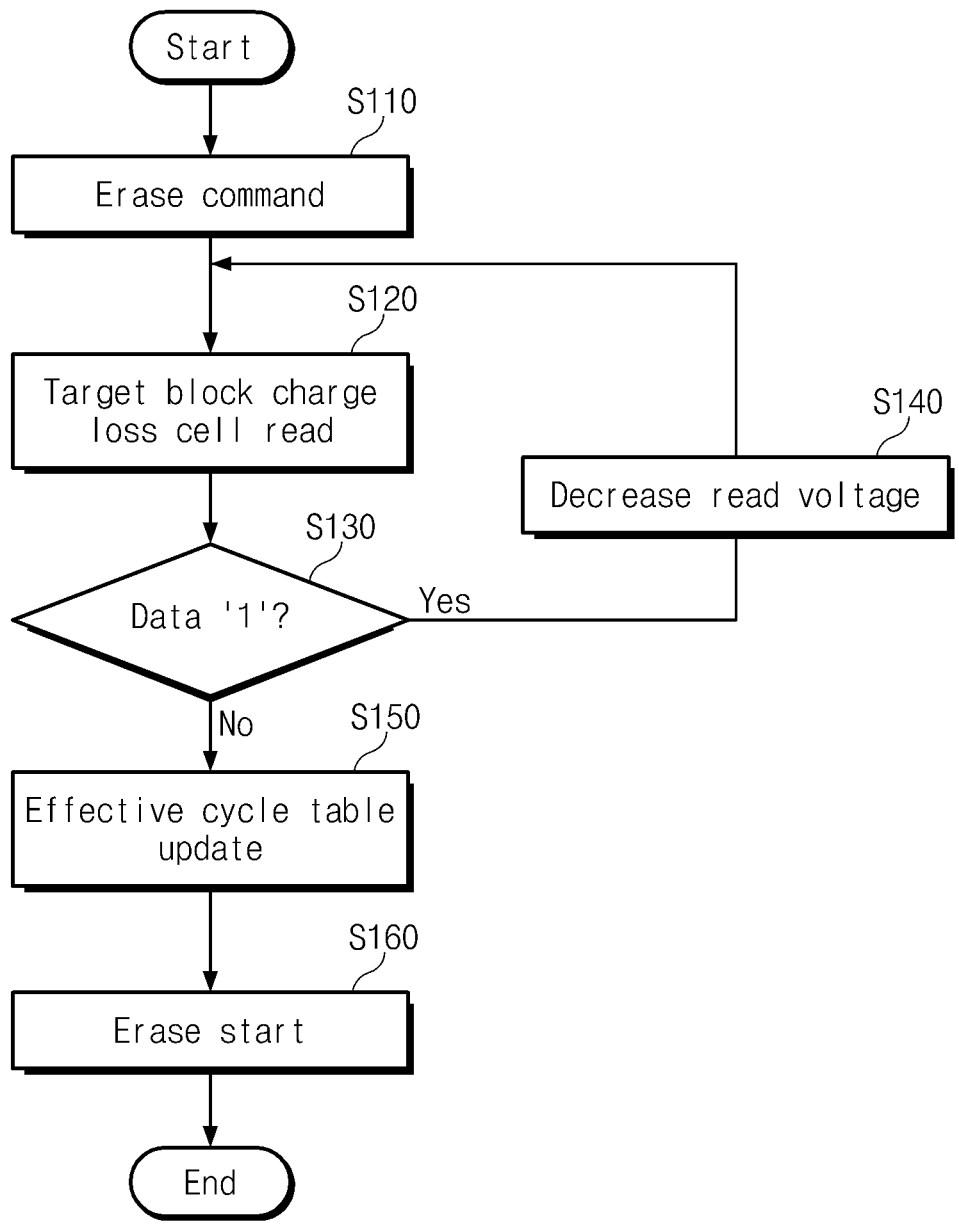
FIG. 7 is a flow chart illustrating a method of updating an effective erase count table according to an embodiment of the inventive concept.

FIG. 7 is a flow chart illustrating a method of updating effective erase count table 120_2 based on a current erase operation on a target memory block according to an embodiment of the inventive concept. This method updates effective erase count table 120_2 to reflect the erasing of the target memory block.

Figure 8:
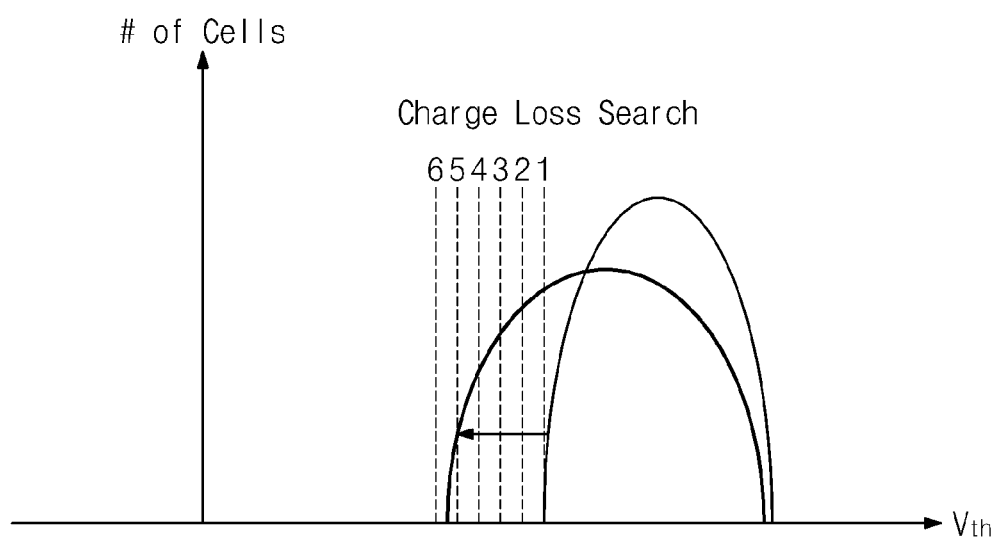
FIG. 8 is a graph illustrating a method of measuring charge loss in a charge loss measurement cell in a memory block within the method of FIG. 7.

Referring to FIGS. 1, 6 and 7, an erase command is received from host 130 (S110). In response to the erase command, threshold voltage shift measurement controller 120_1 reads a value stored in the charge loss measurement cell 111_2 of the target memory block using a read voltage having an initial level (S120). The initial level is typically greater than a threshold voltage of the charge loss measurement cell 111_2, so that it is initially read as storing data '1' (S130). Threshold voltage shift measurement controller 120_1 then applies a gradually decreasing read voltage to the charge loss measurement cell 111_2 until it no longer turns on in response to the read voltage, or in other words, until the read voltage becomes lower than the threshold voltage of the charge loss measurement cell 111_2 (S140). An example of such a gradually decreasing read voltage is illustrated in FIG. 8. Where the threshold voltage of the charge loss measurement cell 111_2 is greater than the read voltage, it is read as storing a '0'.

Once it is determined that the data value of the charge loss measurement cell 111_2 is not '1', threshold voltage shift measurement controller 120_1 stores an effective charge trap amount, or alternatively an effective erase count corresponding to the effective charge trap amount, in effective erase count table 120_2 (S150). The effective charge trap amount can be calculated using a correlation between erase count and charge trap amount as illustrated in FIG. 5. After effective erase count table 120_2 is updated in this manner, an erase operation is performed on the target memory block (S160). Thereafter, when an erase command is again received from host 130, wear leveling can be performed based on the updated effective erase count table 120_2. The wear leveling can be performed, for instance, by erasing a memory block having a relatively low effective erase count in effective erase count table 120_2.

FIG. 8 is a threshold voltage diagram illustrating a method of measuring charge loss in charge loss measurement cell 111_2. The method of FIG. 8 can be used to measure charge loss in each memory block of flash memory device 110 within the method of FIG. 7.

Referring to FIG. 8, the x-axis represents threshold voltage (Vth), and the y-axis represents the number of memory cells having each threshold voltage. The threshold voltage distribution of FIG. 8 shifts due to increases in high temperature stress (HTS) and increased erase count. Accordingly, to detect the threshold voltage of each charge loss measurement cell 111_2, threshold voltage shift measurement controller 120_1 applies a read voltage to each charge loss measurement cell 111_2 with decreasing levels in successive read operations until the read voltage falls below the threshold voltage of the charge loss measurement cell 111_2, as explained with reference to FIG. 7. Examples of the successively decreasing values of read voltage are indicated in FIG. 8 with the labels "1" through "6".

In some embodiments, the methods of FIGS. 7 and 8 can be performed for one or more charge loss measurement cells 111_2 in each memory block of flash memory device 110 to update effective erase count table 120_2.

In some embodiments, effective erase count table 120_2 is included in memory controller 120. However, in other embodiments, effective erase count table 120_2 can be included in another element or feature, such as flash memory device 110.

Figure 9:
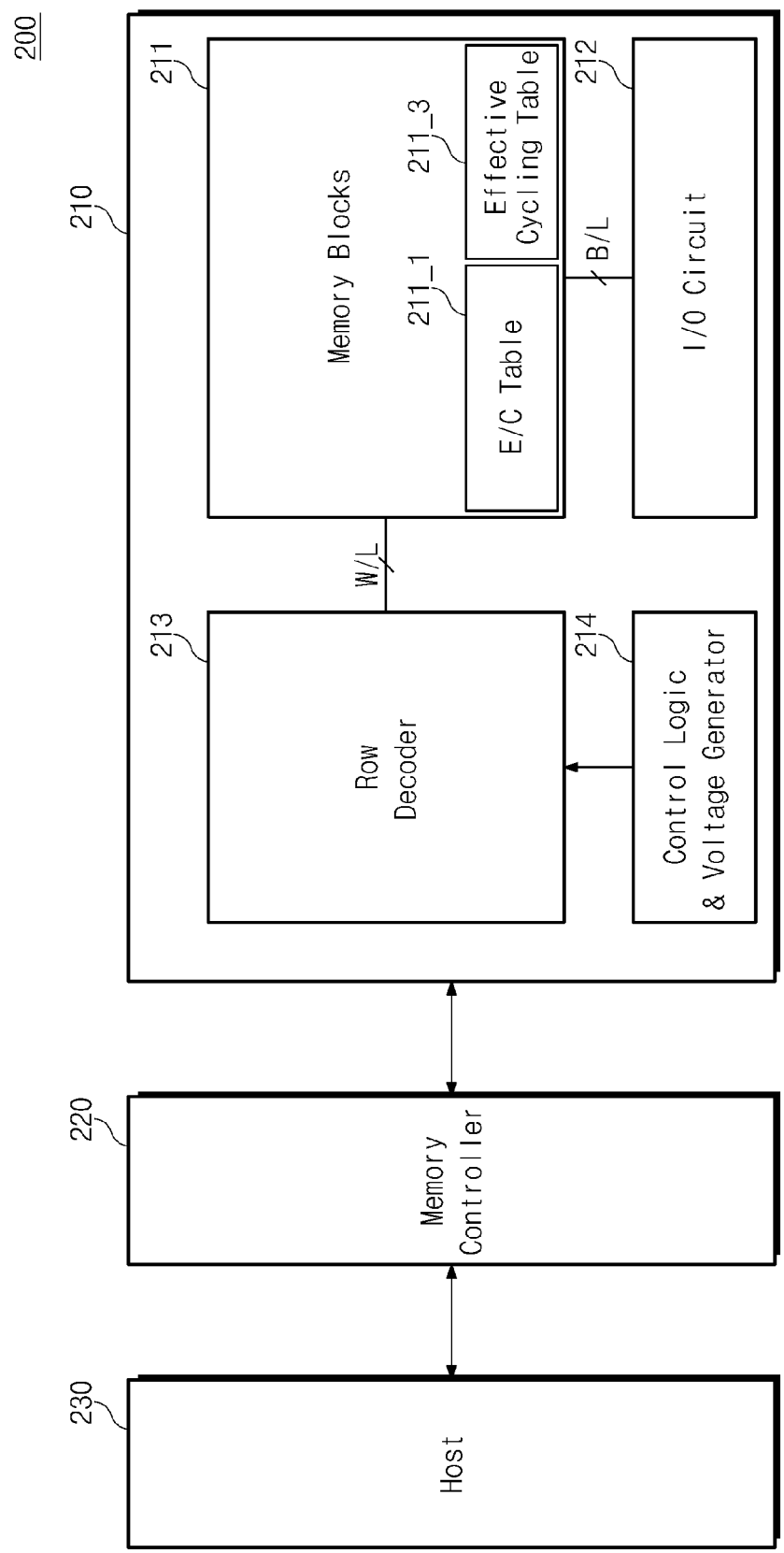
FIG. 9 is a block diagram illustrating a memory system according to an embodiment of the inventive concept.

FIG. 9 is a block diagram illustrating a memory system 200 according to an embodiment of the inventive concept.

Referring to FIG. 9, memory system 200 comprises a flash memory device 210 comprising an effective erase count table 211_3 and an erase count table 211_1. Erase count table 211_1 stores an erase count of each of the memory blocks in flash memory device 210. Erase count table 211_1 can be updated concurrently with effective erase count table 211_3.

Memory system 200 further comprises a host 230 and a memory controller 220, which are similar to host 130 and memory controller 120 of FIG. 1. Memory system 200 further comprises a row decoder 213, control logic and voltage generator 214, an I/O circuit 212, which are similar to row decoder 113, control logic and voltage generator 114, and I/O circuit 112 of FIG. 1.

Figure 10:
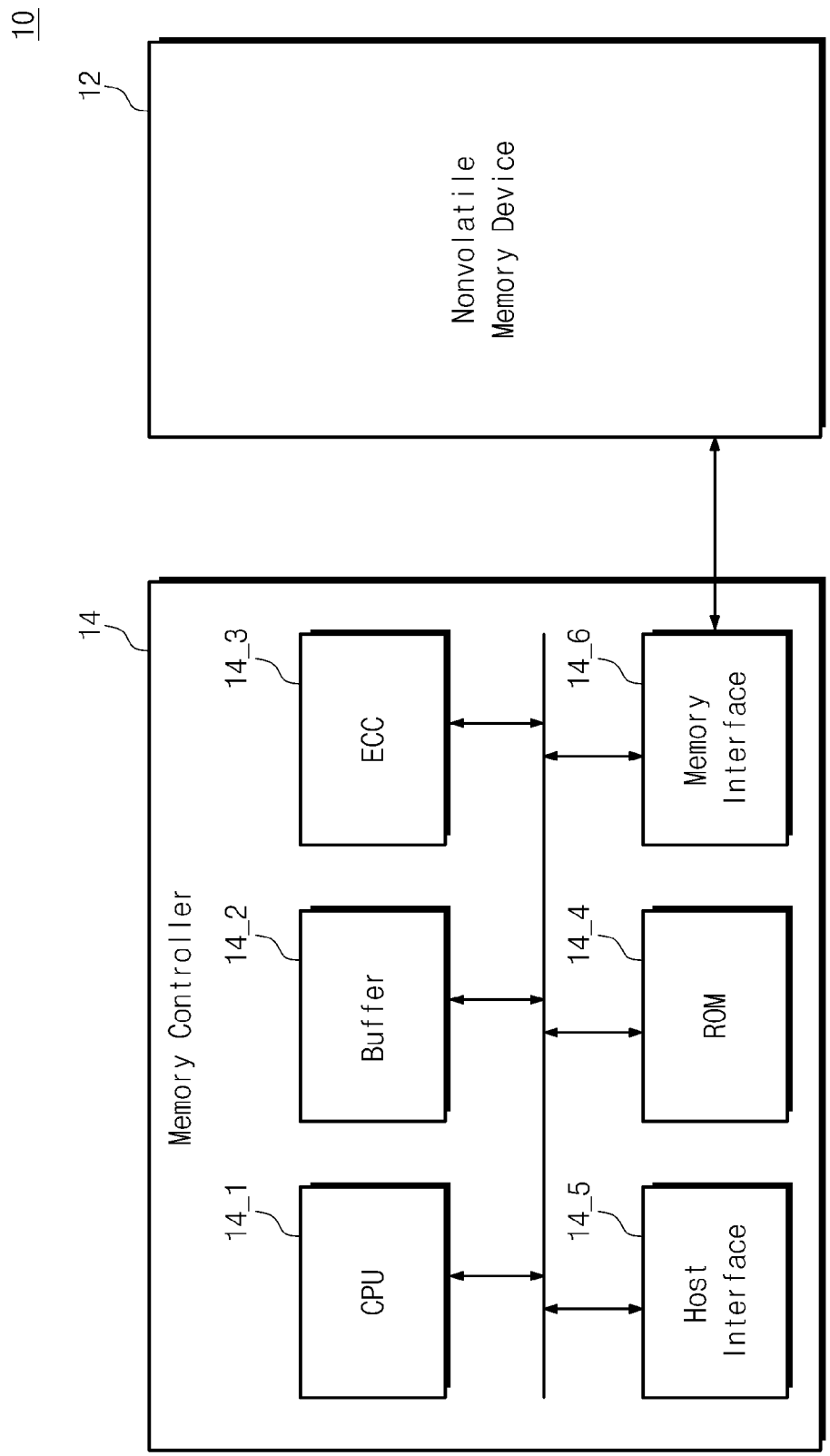
FIG. 10 is a block diagram illustrating a memory system according to an embodiment of the inventive concept.

FIG. 10 is a block diagram illustrating a memory system 10 according to an embodiment of the inventive concept.

Referring to FIG. 10, memory system 10 comprises a nonvolatile memory device 12 and a memory controller 14.

Nonvolatile memory device 12 is implemented in the same manner as one of nonvolatile memory device 110 of FIG. 1 and nonvolatile memory device 210 of FIG. 9. Nonvolatile memory device 12 maintains a uniform wear level according to the measurement value of a charge loss measurement cell and the erase count of each memory block.

Memory controller 14 controls nonvolatile memory device 12 according to a request of an external device (e.g., a host). For example, memory controller 14 may be configured to control a program/read/erase operation of nonvolatile memory device 12.

Memory controller 14 provides an interface between nonvolatile memory device 12 and the host. Memory controller 14 is configured to drive a firmware for controlling nonvolatile memory device 12. Memory controller 14 comprises a central processing unit (CPU) 14_1, a buffer 14_2, an error correction circuit (ECC) 14_3, a read-only memory (ROM) 14_4, a host interface 14_5, and a memory interface 14_6.

CPU 14_1 controls an overall operation of memory controller 14.

Buffer 14_2 is used as a working memory of CPU 14_1. At the write request of the host, data received from the host are temporarily stored in buffer 14_2. Also, at the read request of the host, data read from nonvolatile memory device 12 are temporarily stored in buffer 14_2.

At the write request, the ECC 14_3 uses an error correction code to decode data stored in buffer 14_2. Herein, the decoded data and the error correction code value used are stored in nonvolatile memory device 12. At the read request, the ECC 14_3 uses an error correction code value to recover data read from nonvolatile memory device 12. Herein, the error correction code value is included in the read data.

ROM 14_4 stores data used to drive memory controller 14.

Host interface 14_5 comprises a protocol for data exchange between the host and memory controller 14. For example, memory controller 14 is configured to communicate with an external device (host) through one of various interface protocols such as universal serial bus (USB) protocol, multimedia card (MMC) protocol, peripheral component interconnection (PCI) protocol, PCI-Express (PCI-E) protocol, advanced technology attachment (ATA) protocol, serial-ATA protocol, parallel-ATA protocol, small computer small interface (SCSI) protocol, enhanced small disk interface (ESDI) protocol, and integrated drive electronics (IDE) protocol.

Memory interface 14_6 is configured to interface between nonvolatile memory device 12 and memory controller 14.

Figure 11:
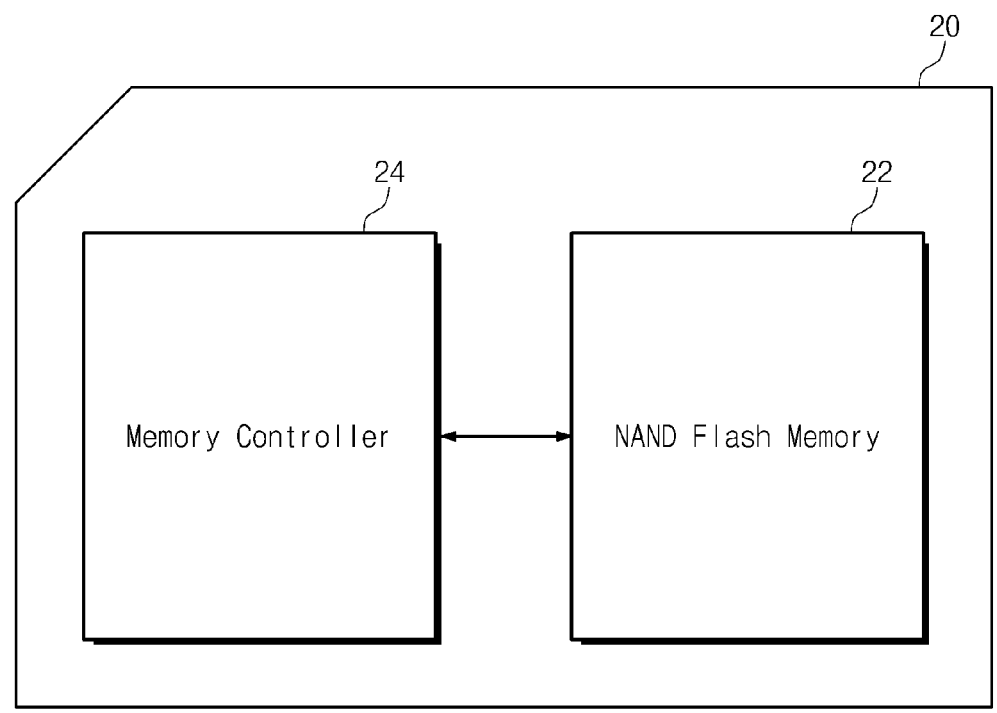
FIG. 11 is a block diagram of a memory card comprising a nonvolatile memory device according to an embodiment of the inventive concept.

FIG. 11 is a block diagram of a memory card 20 comprising a nonvolatile memory device according to an embodiment of the inventive concept.

Referring to FIG. 11, memory card 20 comprises a NAND flash memory device 22 and a memory controller 24 controlling NAND flash memory device 22.

NAND flash memory device 22 comprises is implemented in the same manner as nonvolatile memory device 110 of FIG. 1 or nonvolatile memory device 210 of FIG. 9. Accordingly, NAND flash memory device 22 performs wear level based on measurements performed on a charge loss measurement cell and an erase count of each memory block.

Memory controller 24 is connected to a host and NAND flash memory device 22. Memory controller 24 is configured to access NAND flash memory device 22 in response to a request of the host.

Memory controller 24 drives firmware for controlling NAND flash memory device 22. Memory controller 24 comprises a random access memory, a processing unit, a host interface, and a NAND flash interface. The host interface is configured to interface with the host through a card protocol, such as a multimedia card (MMC) protocol to perform data exchange between the host and memory controller 24.

Memory card 20 can comprise, for instance, an MMC, a security digital (SD) card, a miniSD card, a memory stick, a SmartMedia card, or a TransFlash Card.

Figure 12:
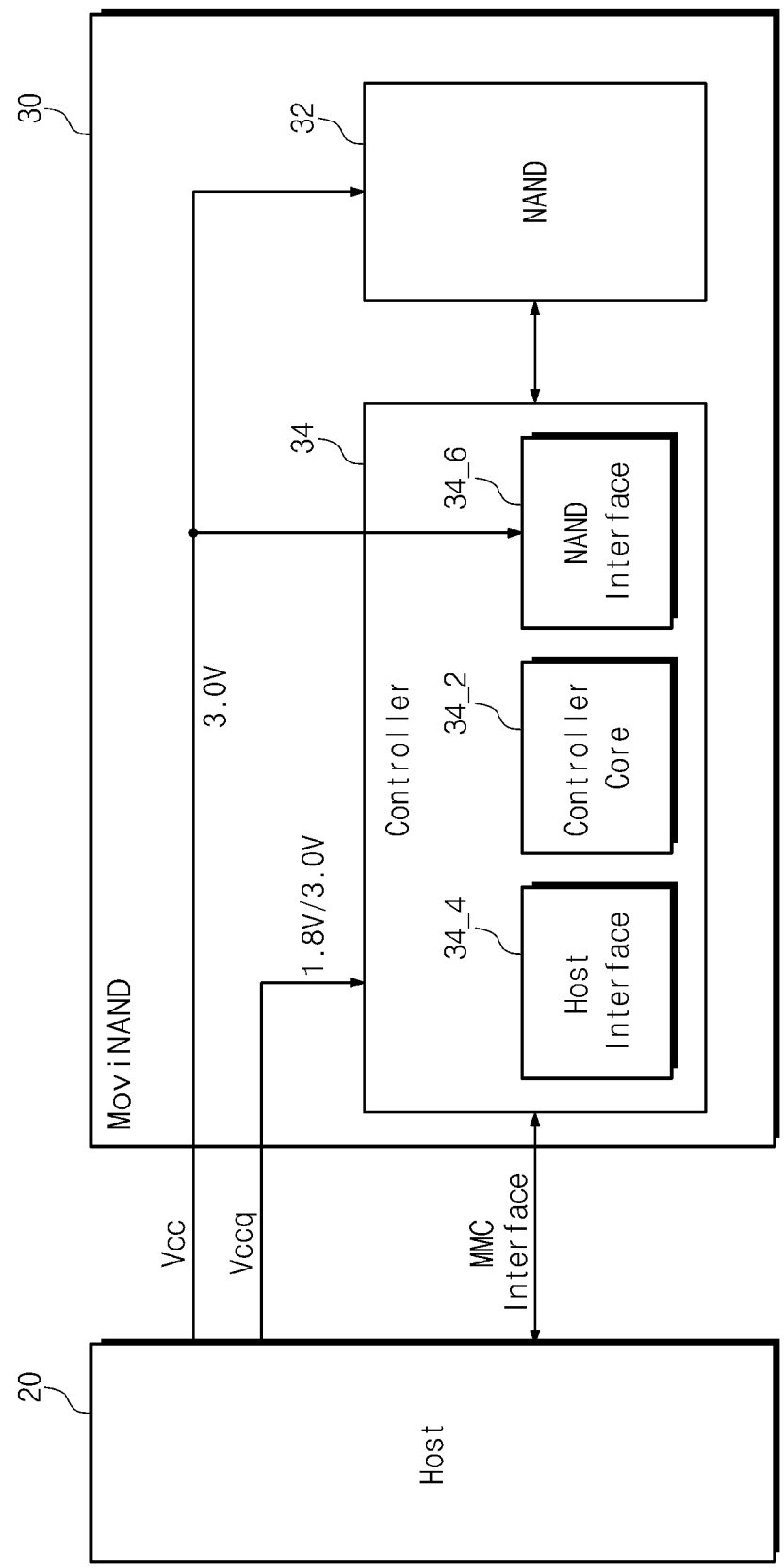
FIG. 12 is a block diagram illustrating a MoviNAND device comprising a nonvolatile memory device according to an embodiment of the inventive concept.

FIG. 12 is a block diagram illustrating a MoviNAND device 30 comprising a nonvolatile memory device according to an embodiment of the inventive concept.

Referring to FIG. 12, MoviNAND device 30 comprises a NAND flash memory device 32 and a controller 34. MoviNAND device 30 is connected to a host in the form of memory card 20.

NAND flash memory device 32 comprises a stack of unitary NAND flash memories in a package, such as a fine-pitch ball grid array package. Each of the unitary NAND flash memories is configured similar to nonvolatile memory device 110 of FIG. 1 or nonvolatile memory device 210 of FIG. 9. Accordingly, NAND flash memory device 32 performs wear level based on measurements performed on a charge loss measurement cell and an erase count of each memory block. Moreover, each of the NAND flash memories comprises multi-level cells or single-level cells.

Controller 34 comprises a controller core 34_2, a host interface 34_4, and a NAND interface 34_6. Controller core 34_2 controls the overall operation of MoviNAND device 30. Host interface 34_4 is configured to interface between controller 34 and an MMC of the host. NAND interface 34_6 is configured to interface between NAND flash memory device 32 and controller 34.

MoviNAND device 30 receives power supply voltages Vcc and Vccq from the host. Power supply voltage Vcc (e.g., about 3V) is supplied to NAND flash memory device 32 and NAND interface 34_6, while power supply voltage Vccq (e.g., about 1.8V/3V) is supplied to controller 34.

Figure 13:
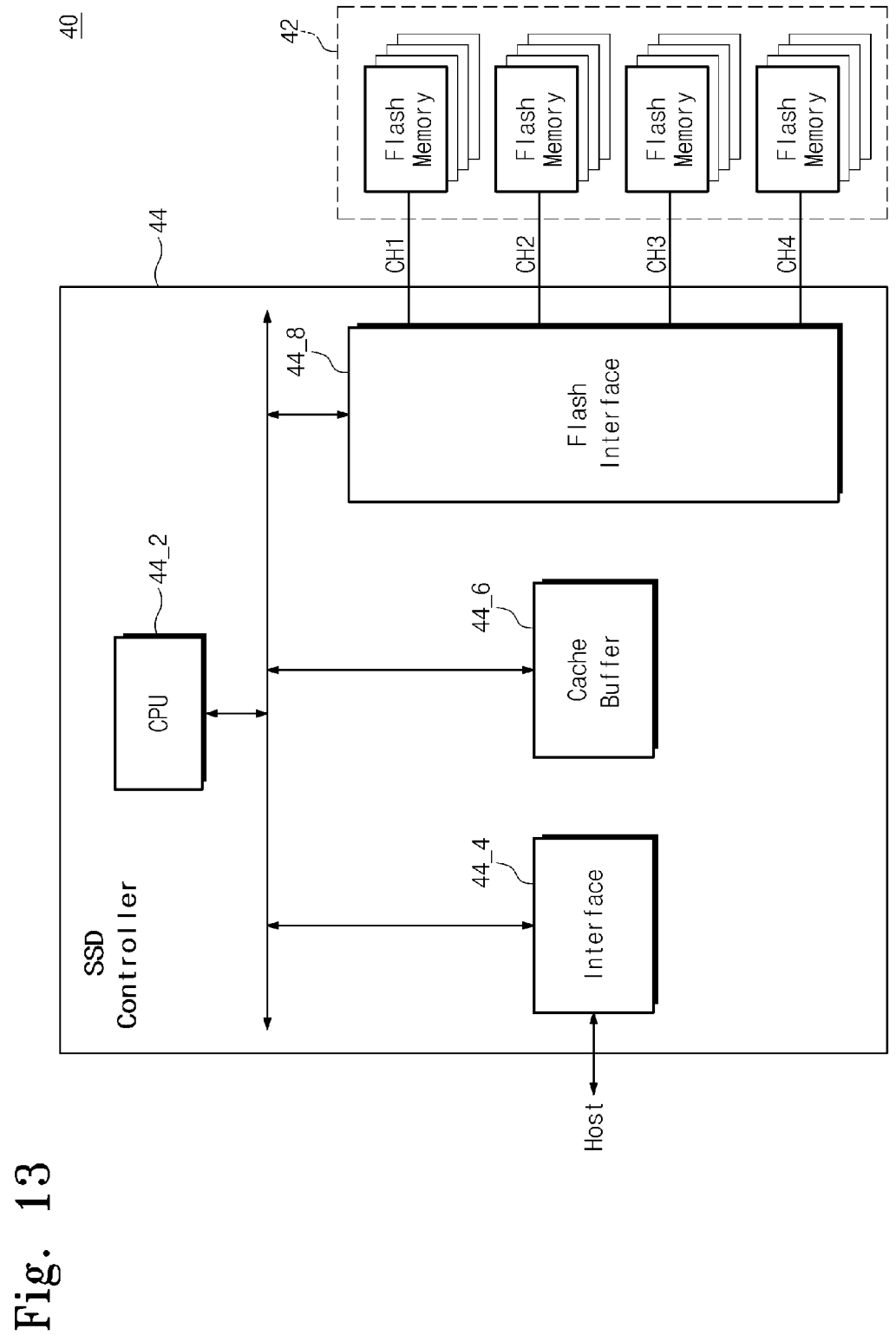
FIG. 13 is a block diagram illustrating an SSD according to an embodiment of the inventive concept.

FIG. 13 is a block diagram illustrating an SSD 40 according to an embodiment of the inventive concept.

Referring to FIG. 13, SSD 40 comprises a plurality of flash memory devices 42 and an SSD controller 44.

Each of flash memory devices 42 is implemented in the same manner as nonvolatile memory device 110 of FIG. 1 or nonvolatile memory device 210 of FIG. 9. Accordingly, each of flash memory devices 42 performs wear level according to a measurement performed on a charge loss measurement cell and an erase count of each memory block.

SSD controller 44 comprises a CPU 44_2, an interface 44_4, a cache buffer 44_6, and a flash interface 44_8.

Interface 44_4 exchanges data with a host through ATA protocol under the control of CPU 44_2. Interface 44_4 can comprise, for instance, a serial advanced technology attachment (SATA) interface, a parallel advanced technology attachment (PATA) interface, or an external SATA (ESATA) interface.

Data received/transmitted from/to the host through interface 44_4, is transferred through cache buffer 44_6 without passing through a CPU bus, under the control of CPU 44_2.

Cache buffer 44_6 temporarily stores data transferred between an external device and flash memory devices 42. Cache buffer 44_6 is also used to store programs to be executed by CPU 44_2. Cache buffer 44_6 can be regarded as a buffer memory, and can be implemented using an SRAM.

Flash interface 44_8 is configured to interface between SSD controller 44 and flash memory devices 42 used as storage devices. In certain embodiments, flash interface 44_8 is configured to support NAND flash memories, One-NAND flash memories, multi-level flash memories, or single-level flash memories.

Figure 14:
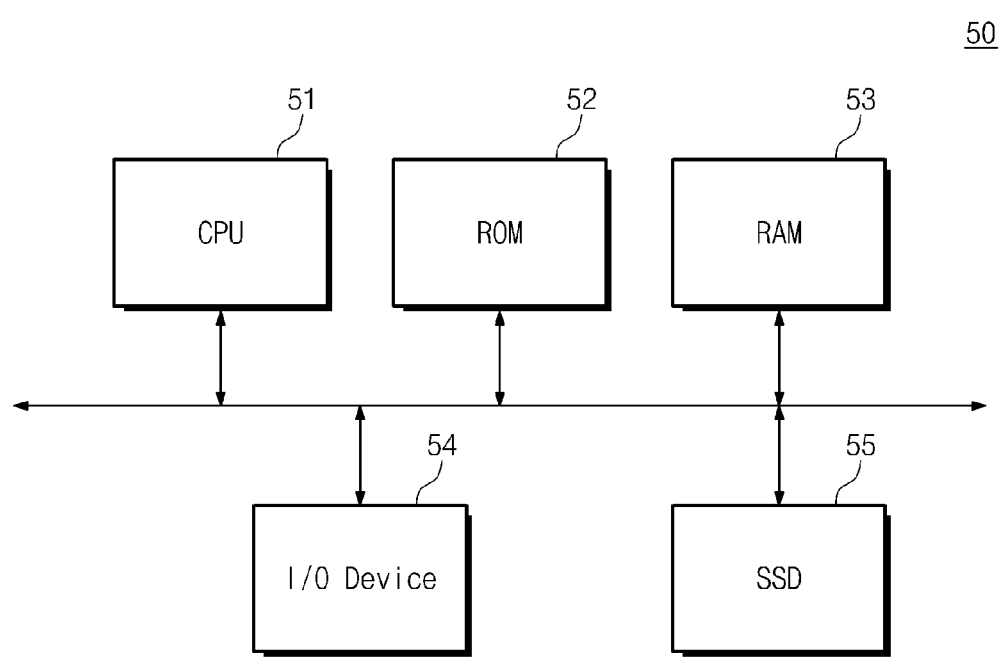
FIG. 14 is a block diagram illustrating a computing system according to an embodiment of the inventive concept.

FIG. 14 is a block diagram illustrating a computing system 50 according to an embodiment of the inventive concept.

Referring to FIG. 14, computing system 50 comprises a CPU 51, a ROM 52, a RAM 53, an input/output (I/O) device 54, and an SSD 55. These components are connected to each other through a system bus.

CPU 51 controls overall operations of computing system 50. ROM 52 stores data used to operate computing system 50, such as a start command sequence or a basic I/O system (BIOS) sequence. RAM 53 temporarily stores data generated by the operation of CPU 51. I/O device 54 is connected to the system bus through an I/O device interface. Examples of I/O device 54 include keyboards, pointing devices (mouse), monitors, and modems. SSD 55 functions as a readable storage device and can be implemented in the same manner as SSD 40 of FIG. 13.

Figure 15:
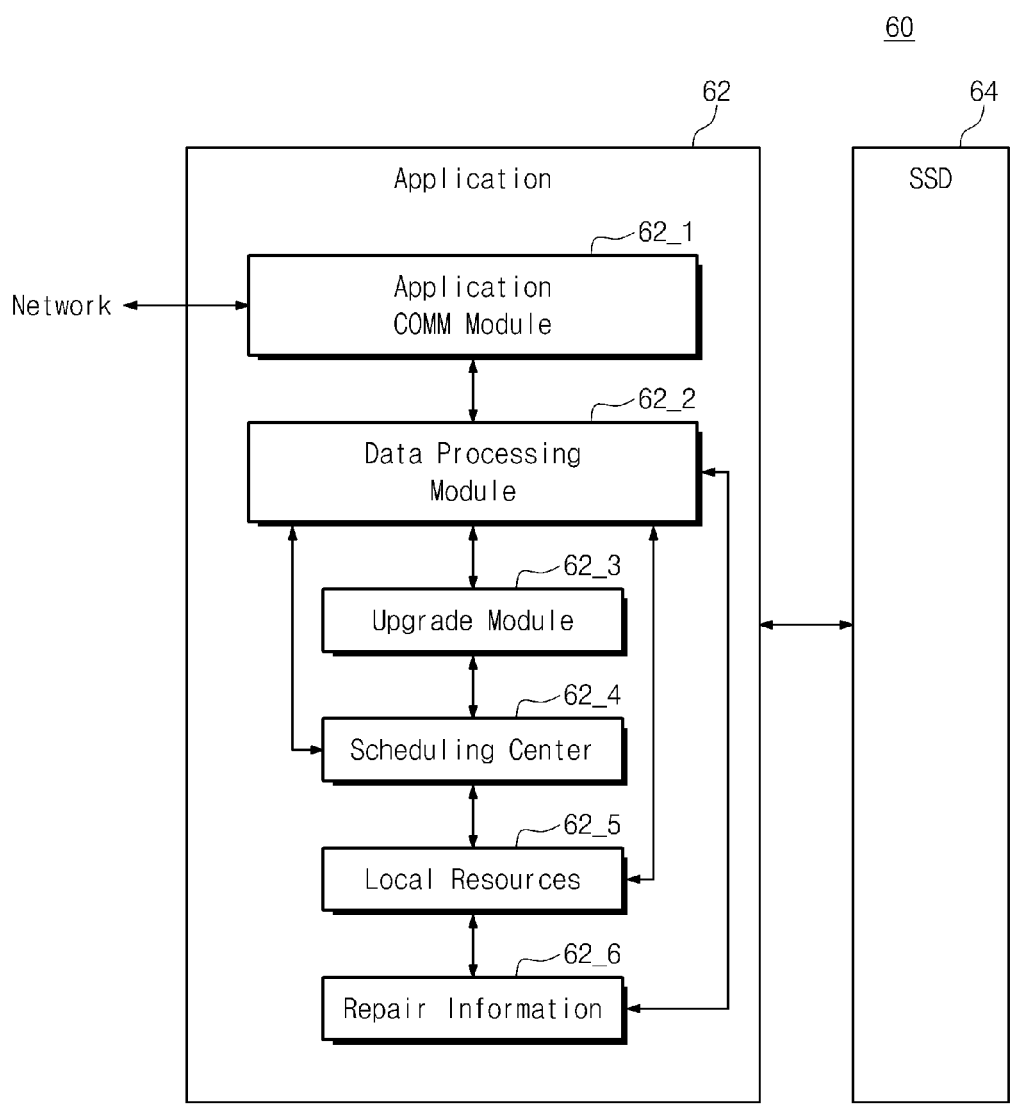
FIG. 15 is a block diagram illustrating a server system comprising an SSD according to an embodiment of the inventive concept.

FIG. 15 is a block diagram illustrating a server system 60 comprising an SSD according to an embodiment of the inventive concept.

Referring to FIG. 15, server system 60 comprises a server 62 and an SSD 64 that stores data used to operate server 62. SSD 64 is configured similar to SSD 40 of FIG. 13.

Server 62 comprises an application communication module 62_1, a data processing module 62_2, an upgrade module 62_3, a scheduling center 62_4, a local resource module 62_5, and a repair information module 62_6.

Application communication module 62_1 is configured to communicate with a computing system connected to server 62 and a network, or to provide communication between server 62 and SSD 64. Application communication module 62_1 transmits information or data provided through a user interface, to data processing module 62_2.

Data processing module 62_2 performs data processing operations for server 62 and is linked to upgrade module 62_3, scheduling center 62_4, and local resource module 62_5.

Upgrade module 62_3 interfaces with data processing module 62_2 and upgrades firmware, reset code, or other system information based on information or data received from SSD 64.

Scheduling center 62_4 provides scheduling for real-time options based on data input to server 62.

Local resource module 62_5 stores information regarding local resources and provides the information to a user based on information or data input to server 62.

Repair information module 62_6 interfaces with data processing module 62_2 and provides repair-related information, such as audio, video, or document files to a user. Data processing module 62_2 processes and packages information generated by server 62 based on information received from SSD 64. The packaged information is transmitted to SSD 64 or is displayed to a user.

Figure 16:
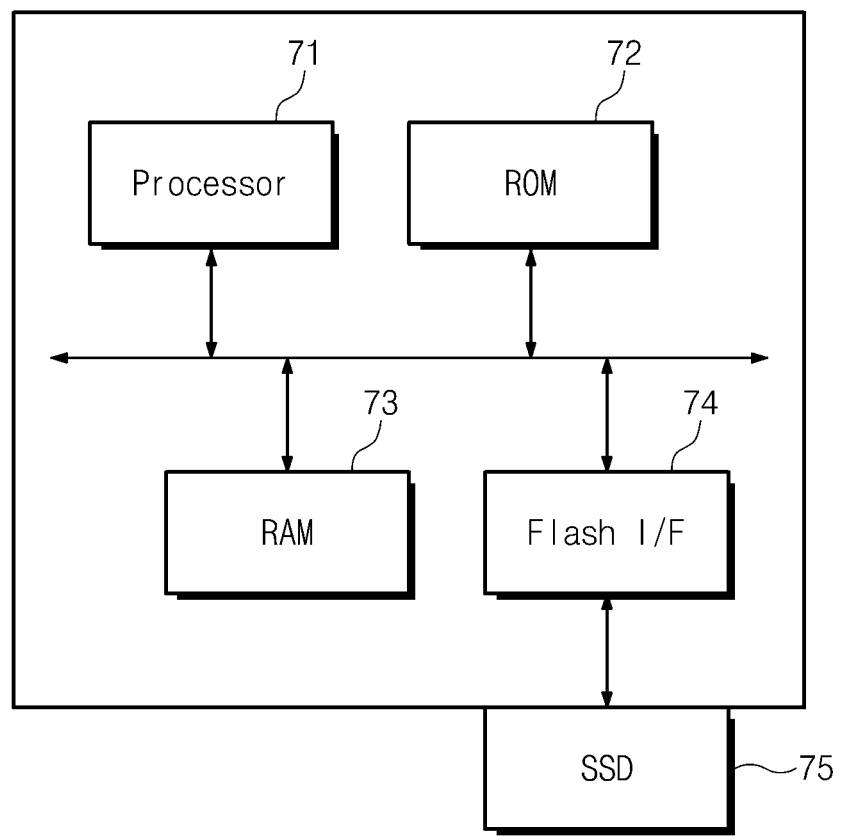
FIG. 16 is a block diagram of an electronic device according to an embodiment of the inventive concept.

FIG. 16 is a block diagram of an electronic device 70 according to an embodiment of the inventive concept.

Referring to FIG. 16, electronic device 70 comprises a processor 71, a ROM 72, a RAM 73, a flash interface (I/F) 74, and an SSD 75.

Processor 71 accesses RAM 73 to execute firmware codes or random codes. Processor 71 accesses ROM 72 to execute various command sequences such as a start command sequence and a basic I/O system (BIOS) sequence. Flash interface 74 is configured to provide interface functions between electronic device 70 and SSD 75.

SSD 75 can be detachable from electronic device 70, and may be implemented similar to SSD 40 of FIG. 13.

Electronic device 70 can be implemented in a variety of forms, such as a cellular phone, personal digital assistant, digital camera, camcorder, portable audio player, or a portable media player, to name just a few.

The above described memory systems, and storage devices can be mounted in various types of packages. Examples of such package types include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), and wafer-level processed stack package (WSP).

Although the above embodiments relate to nonvolatile memory devices and systems, as well as wear leveling methods for nonvolatile memory devices, the inventive concept can also be embodied in volatile memory devices that require wear leveling.

As indicated by the foregoing, certain embodiments of the inventive concept allow nonvolatile memory devices and systems to perform wear leveling based on actual characteristics of memory cells rather than a simple erase count. Accordingly, these embodiments can potentially improve the performance and lifetime of the nonvolatile memory devices and systems.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of operating a nonvolatile memory device comprising a plurality of memory blocks each comprising at least one charge loss measurement cell, the method comprising:
    measuring a threshold voltage change of the at least one charge loss measurement cell in a selected memory block among the plurality of memory blocks;
    detecting an erase count of the selected memory block; and
    calculating an effective erase count of the selected memory block based on the measured threshold voltage change and the erase count.

2. The method of claim 1, further comprising:
    controlling the wear levels of memory blocks according to the calculated effective erase count.

3. The method of claim 1, further comprising:
    storing the effective erase count of the selected memory block in an effective erase count table within the nonvolatile memory device, the effective erase count table comprising effective erase count values for each of the plurality of memory blocks.

4. The method of claim 1, further comprising:
    erasing the selected memory block.

5. The method of claim 3, further comprising:
    performing wear leveling by accessing the effective erase count table to determine a next memory block to erase.

6. The method of claim 1, wherein measuring the threshold voltage change comprises:
    reading the at least one charge loss measurement cell using a read voltage; and
    iteratively decreasing the read voltage by a predetermined amount until a value read from the at least one charge loss measurement cell changes logic state.

7. The method of claim 5, wherein the next memory block to erase is a memory block having a lowest effective erase count in the effective erase count table.

8. The method of claim 1, wherein the nonvolatile memory device is a NAND flash memory device.

9. The method of claim 1, wherein the nonvolatile memory device is a multi-level cell flash memory device.

10. A nonvolatile memory device comprising:
    a plurality of memory blocks each comprising at least one charge loss measurement cell;
    an erase count table storing an erase count of each of the memory blocks; and
    an effective erase count table storing effective erase count values for each of the memory blocks, wherein each of the effective erase count values is calculated according the erase count of a corresponding memory block and a threshold voltage change level measured from the at least one charge loss measurement cell of the corresponding memory block.

11. The nonvolatile memory device of claim 10, wherein wear levels of the memory blocks are maintained substantially uniform according to the effective erase count table.

12. A memory system comprising:
    a nonvolatile memory device comprising a plurality of memory blocks; and
    a memory controller configured to control the nonvolatile memory device, to measure a wear level of each of the memory blocks, and to control wear levels of the memory blocks according to the measured wear level and an erase count,
    wherein the memory controller measures a wear level of each of the memory blocks by determining a threshold voltage shift of at least one threshold voltage charge loss measurement cell within each of the memory blocks, and
    wherein the memory controller comprises a threshold voltage shift measure controller configured to measure a threshold voltage of the at least one charge loss measurement cell, to calculate the threshold voltage shift according to the measured threshold voltage, and to calculate an effective erase count of each of the memory blocks according to the erase count and the calculated threshold voltage change.

13. The memory system of claim 12, wherein the nonvolatile memory device is a NAND flash memory device.

14. The memory system of claim 12, wherein the memory controller determines a wear level of a memory block based on a time interval since a last read or write operation performed on the memory block.

15. The memory system of claim 12, wherein the memory controller determines a wear level of a memory block based on an operating temperature of the memory block.

16. The memory system of claim 12, wherein the at least one charge loss measurement cell is in a programmed state when the threshold voltage shift is determined.

17. The memory system of claim 12, wherein the memory controller comprises an effective erase count table for storing the effective erase count.

18. The memory system of claim 12, wherein the memory controller controls the wear levels by accessing the effective erase count table and identifying a memory block having a lowest effective erase count as a next memory block to erase.

* * * * *